United States Patent [19]
Yamaguchi

[11] Patent Number: 5,134,463
[45] Date of Patent: Jul. 28, 1992

[54] STRESS RELIEF LAYER PROVIDING HIGH THERMAL CONDUCTION FOR A SEMICONDUCTOR DEVICE

[75] Inventor: Tetsuji Yamaguchi, Fukuoka, Japan

[73] Assignee: Mitsubishi Denki Kabushiki Kaisha, Tokyo, Japan

[21] Appl. No.: 595,408

[22] Filed: Oct. 11, 1990

[30] Foreign Application Priority Data

Oct. 23, 1989 [JP] Japan ................. 1-275434

[51] Int. Cl.⁵ ................ H01L 23/02; H01L 23/12
[52] U.S. Cl. ................................ 357/81; 357/74; 357/71; 361/388; 361/389
[58] Field of Search ............. 357/81, 74, 67, 71, 357/80; 361/386, 388, 389

[56] References Cited

U.S. PATENT DOCUMENTS 3,296,501  1/1967  Moore ................... 357/81
3,399,332  8/1968  Savolainen ............. 357/81
4,427,993  1/1984  Fichot et al. .......... 357/81
4,825,284  4/1989  Soga et al. ............ 357/81

FOREIGN PATENT DOCUMENTS 57-124459  8/1982  Japan .
58-32423   2/1983  Japan .

Primary Examiner—William Mintel
Assistant Examiner—David Ostrowski
Attorney, Agent, or Firm—Oblon, Spivak, McClelland, Maier & Neustadt

[57] ABSTRACT

A semiconductor chip (27) is soldered on an electrode plate (24) with a thermal relaxation plate (40) therebetween. The thermal relaxation plate has a frame member (41) made of covar or invar and a plate member (42) made of copper. The plate member is inserted into the window space defined in the frame member and is united with the frame member.

20 Claims, 3 Drawing Sheets

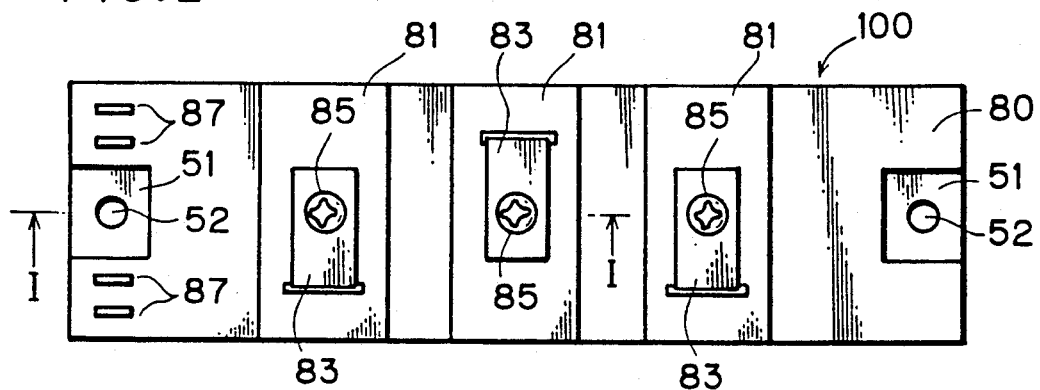
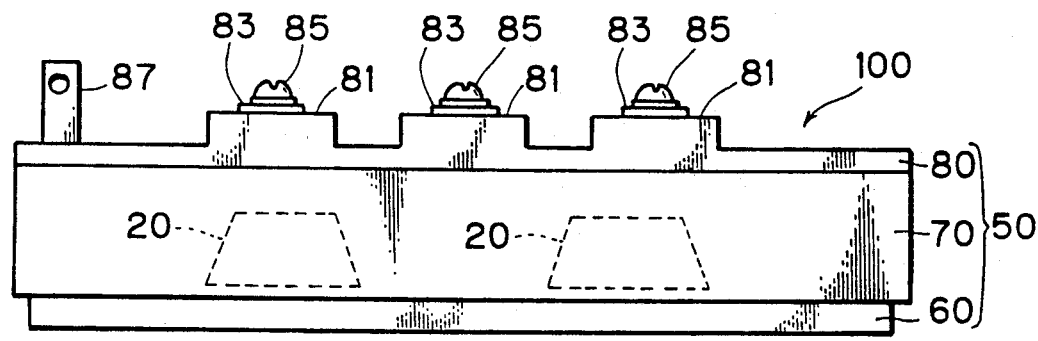
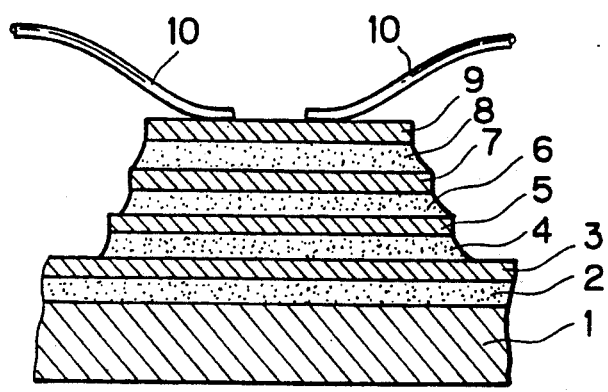

STRESS RELIEF LAYER PROVIDING HIGH THERMAL CONDUCTION FOR A SEMICONDUCTOR DEVICE

BACKGROUND OF THE INVENTION

1. Field of the Invention

The present invention relates to a semiconductor device and a soldering method for its manufacture, and particularly to improvement of a thermal stress relaxation member equipped to relax the thermal stress in a semiconductor chip and a method of soldering the semiconductor chip on a prescribed member using the improved thermal stress relaxation member.

2. Description of the Background Art

As known well in semiconductor device manufacturing technology, there are many cases wherein a semiconductor chip formed with desired active regions is soldered on a prescribed member such as an electrode plate. FIG. 6 shows a partial section showing conventional typical soldered structure of a semiconductor chip 9. As shown in FIG. 6, a heat diffusion plate 1, an insulating base plate 3, an electrode plate 5 and a thermal stress relaxation plate 7 are soldered consecutively by using solder layers 2, 4 and 6. The semiconductor chip 9 is soldered on the thermal stress relaxation plate 7 through a solder layer 8. In case the semiconductor chip 9 is a power transistor, for example, the electrode plate 5 corresponds to a collector electrode plate. In addition, the other electrode plates for the semiconductor chip 9, that is, an emitter electrode plate and a base electode plate (not shown) are connected to the semiconductor chip 9 through metallic wires 10.

Among these members, the thermal stress relaxation plate 7 is equipped in order to relax thermal stress generating within the semiconductor chip 9 during soldering process. In case the semiconductor chip 9 is made of silicon and the metallic collector plate 5 is made of copper, since coefficient of thermal expansion of the collector metallic plate 5 is around five times as much as that of the semiconductor chip 9, difference between respective shrinking is great when these are cooled from high temperature conditions in soldering. Accordingly, if the thermal stress relaxation plate 7 is not equipped, the thermal stress corresponding to this difference is directly applied to the semiconductor chip 9 to deteriorate electric characters and strength thereof. Furthermore, the thermal stress relaxation plate 7 is effective for relaxing thermal stress due to heat which is generated during electric current flow through the semiconductor chip 9.

Since the thermal stress relaxation plate 7 is provided for these reasons, the thermal stress relaxation plate 7 must be made of material of which coefficient of thermal expansion is comparatively similar to that of silicon. Besides since heat which generates during operation of the semiconductor chip 9 must be quickly transmitted to the heat diffusion plate 1, large thermal conductivity is necessary for the plate 7. Therefore, a molybdenum flat plate is widely used as a conventional thermal stress relaxation plate 7.

However, the molybdenum flat plate is formed by sintering and is very high in the cost, so that the cost of the semiconductor device equipped with the structure in FIG. 6 is also high.

In addition, as thermal conductivity of the molybdenum is not so large, and efficiency of transmitting to the heat diffusion plate 1 the heat generating during operation of the semiconductor chip 9 is not so high. In other words, in case the molybdenum flat plate is used as the thermal stress relaxation plate 7, it is difficult to reduce transient thermal resistance thereof. This problem turns out to be especially serious upon a transistor for large electric power in which high speed switching operation is repeated.

In order to cope with such a problem, technology using a copper plate embedded with carbon fibers is disclosed in Japanese Patent Laying-Open Gazettes No. 58-32423 (1983) and No. 57-124459 (1982). In this technology, high thermal conductivity is secured by copper and coefficient of thermal expansion is lowered by carbon fibers.

However, in order to suppress thermal expansion of the copper plate, a lot of carbon fibers must be embedded within the copper plate. On the occasion, local warping generates on the thermal stress relaxation plate in high temperature soldering using hard solder. Actually, in the above-indicated Gazette No. 57-124459, it is described that when soldering is carried out above 700° C., the warping of the thermal stress relaxation plate suddenly increases.

In addition, since the thermal conductivity and the electric conductivity of carbon fibers are low as compared with those of metal, if large quantity of carbon fibers is embedded in Cu, the total thermal conductivity and the total electric conductivity of the plate are to too low.

SUMMARY OF THE INVENTION

According to the present invention, a semiconductor device comprises (a) a conductive member having electric conductivity, (b) a first solder layer provided on the conductive member, (c) a composite plate member provided on the first solder layer and comprising (c-1) at least one frame member made of a first material and having a window space therein, and (c-2) a plate member made of a second material which is inserted into the window space and is unified with the frame member so that the plate member is substantially in contact with the first solder member through a first opening of the window space, (d) a second solder member provided on the composite plate member so that the composite plate member is substantially in contact with the second solder member through a second opening of the window space, and (e) a semiconductor chip provided on the second solder layer. The first material has a coefficient of thermal expansion equal to or less than three times a coefficient of thermal expansion of the semiconductor chip, and the second material is selected from the group consisting of copper, copper alloys, aluminum and aluminum alloys.

The present invention also provides a thermal stress relaxation plate employable in a semiconductor device for relaxing a thermal stress in a semiconductor chip, comprising (a) at least one frame member made of a first material and having a window space therein, and (b) a plate member made of a second material which is inserted into the window space and is unified with the frame member so that the plate member has two surfaces which expose at respective window openings of the window space, wherein the first material has coefficient of thermal expansion equal to or less than three times a coefficient of thermal expansion of the semiconductor chip, and the second material is selected from the group consisting of copper, copper alloys, aluminum and aluminum alloys.

In an aspect of the present invention, is provided a method of soldering a semiconductor chip on a prescribed position, comprising the steps of (a) preparing a composite plate member comprising at least one frame member made of a first material and having a window space therein, and a plate member made of a second material which is inserted into the window space and is unified with the frame member so that the plate member exposes at first and second openings of the window space, wherein the first material has a coefficient of thermal expansion equal to or less than three times a coefficient of thermal expansion of the semiconductor chip, and the second material is selected from the group consisting of copper, copper alloys, aluminum and aluminum alloys, (b) soldering the composite plate member on the prescribed position while making the first opening face to the prescribed position, and (c) soldering the semiconductor chip on the composite plate member while making the semiconductor chip face to the second opening.

According to the semiconductor device of the present invention either of copper, aluminum, or their alloys is used as a plate member in the composite plate member, so that thermal conductivity and electric conductivity of the composite plate member is high as a whole. In addition, since a frame member is made of an alloy having coefficient of thermal expansion three times as high as or less than that of a semiconductor chip to suppress thermal expansion of a plate member, a relaxation effect of the whole composite plate member against thermal stress of a semiconductor chip is large. As the composite member of the present invention can be composed without incorporating such materials as sintered molybdenum and carbon fibers, they are low in cost and usable even under high soldering temperature conditions. In addition, according to the soldering method of the present invention, a semiconductor device with the above characteristics can be obtained without complicate processing.

Accordingly, an object of the present invention is to provide a low cost semiconductor device equipped with a thermal stress relaxation member which is high in thermal conductivity and electric conductivity and is less in restriction on a soldering temperature.

Another object of the present invention is to provide a method of soldering a semiconductor chip for manufacturing such a semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 and FIG. 3 are a plane view and an elevation view of the semiconductor device in FIG. 1, respectively, FIG. 6 is a partial sectional view showing conventional soldering structure.

DESCRIPTION OF THE PREFERRED EMBODIMENTS

Figure 1:
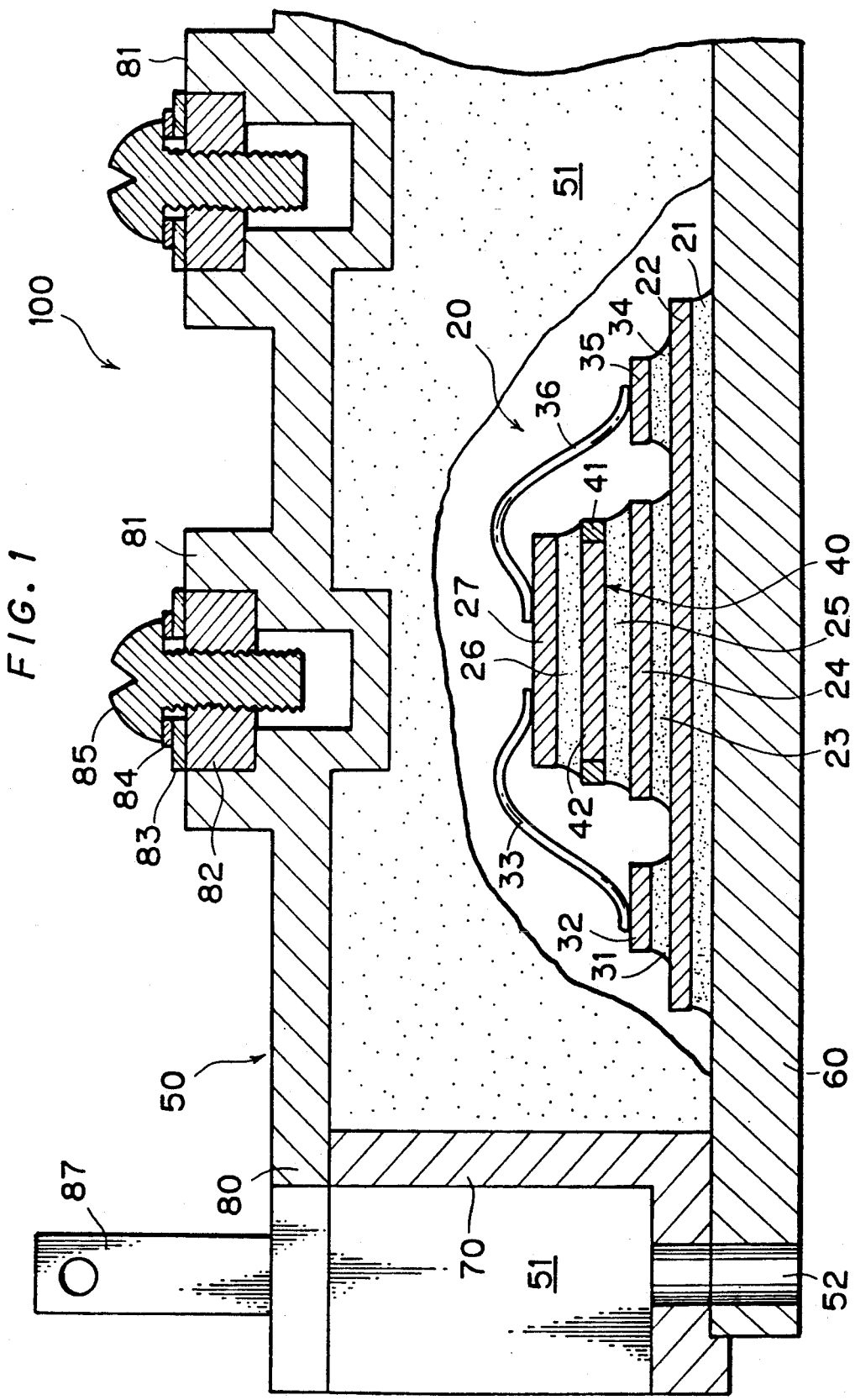
FIG. 1 is a partial sectional view of a semiconductor device according to a preferred embodiment of the present invention.

FIG. 2 and 3 are a plane view and an elevation view showing external appearance of a semiconductor device 100 according to a preferred embodiment of the present invention, respectively. FIG. 1 is an enlarged partial sectional view along line I—I in FIG. 2. The semiconductor device 100 comprises a plurality of power transistor assemblies 20 schematically shown in FIG. 3 and a casing 50 receiving these assemblies 20. The casing 50 has a heat diffusion plate 60 made of copper as a bottom plate on which a resin side member 70 is fixed with an adhesive agent. A resin lid 80 is fixed on the side member 70 so that it covers upper opening of the side member 70.

On both edges of the casing 50, concaves 51 are formed. As shown in FIG. 1, at the bottom of each concave 51, a fitting hole 52 used for fixing the semiconductor device 100 to a desired position is provided. On the other hand, convexes 81 are provided on three positions of the lid 80. A nut 82 (FIG. 1) is pressed into the convex 81, and a bolt 85 is screwed into the nut 82 through an external electrode plate 83 and a washer 84. External wires such as bus bars are connected to the external electrode plate 83 through combination of the bolt 85 and the nut 82. Though not shown in FIG. 1-3, one edge of each external electrode plate 83 is bent, and electrically connected through the lid 80 to an electrode inside the power transistor assembly 20 in the casing 50.

Fastening terminals 87 are installed on the top of the casing 50, and a control signal for the transistor assembly 20 is applied to the fastening terminals 87, and then transmitted to a control electrode in the assembly 20 through internal wiring not shown. A status in which part is removed is depicted in FIG. 1, but in order to protect from outside atmosphere the transistor assemblies 20 and each internal wire, the transistor assemblies 20 are sealed with resin 51 inside an internal space of the casing 50.

Each of the transistor assemblies 20 is manufactured as follows (refer to FIG. 1): An insulating base plate 22 made of alumina-ceramics is soldered on the heat diffusion plate 60 through a solder layer 21. A collector electrode plate 24 made of copper is soldered on the center of the upper surface of the insulating base plate 22 through a solder layer 23. On the top surface of this collector electrode plate 24, a thermal stress relaxation plate 40 is soldered through a solder layer 25. The structure of this thermal stress relaxation plate 40 will be described later in detail.

On the thermal stress relaxation plate 40, a semiconductor chip 27 is soldered through a solder layer 26. The semiconductor chip 27 is formed by selectively doping impurities into a silicon substrate and is a power transisitor containing junctions between a plurality of active regions.

On the top surface of the insulating base plate 22, an emitter electrode plate 32 made of copper is soldered through a solder layer 31. Likewise, a base electrode plate 35 made of copper is soldered on the plate 22 through a solder layer 34. These emitter electrode plate 32 and base electrode plate 35 connected to an emitter region and a base region of the semiconductor chip 27 through aluminum wires 33 and 36, respectively. The other ones of the transistor assemblies 20 not shown in FIG. 1 also have the same structure, a plurality of the transistor assemblies 20 being connected each other through wiring and their output being led to the external electrode plates 83.

Figure 4:
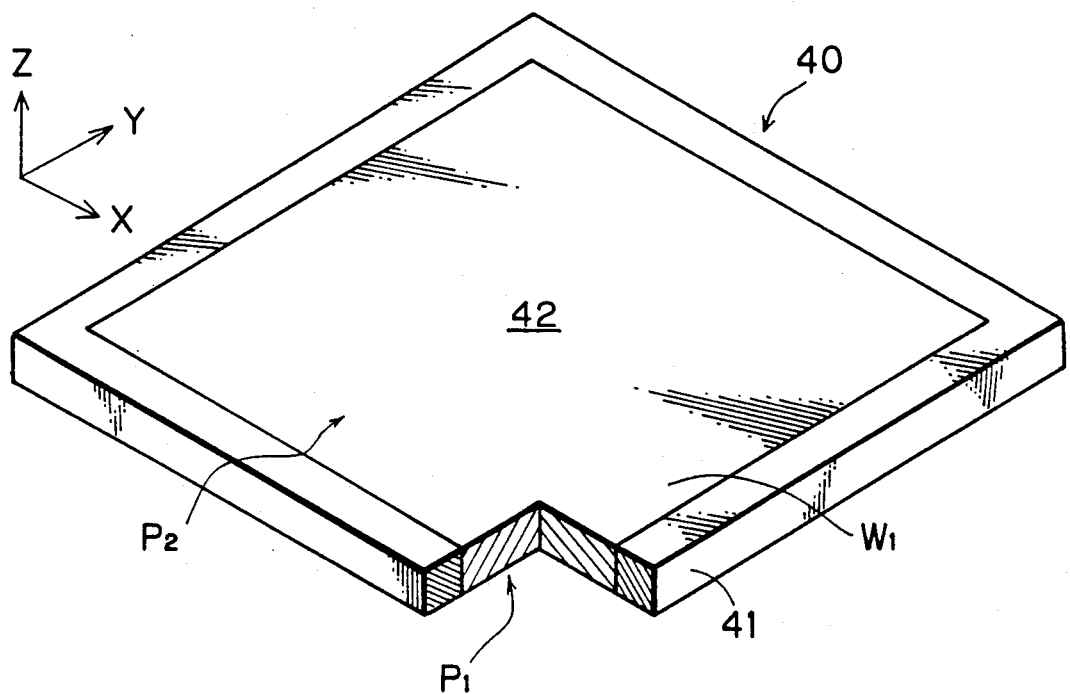
FIG. 4 and FIG. 5 are perspective views of thermal stress relaxation plates with part taken away.

FIG. 4 is a perspective view of the thermal stress relaxation plate 40 with part taken away. The thermal stress relaxation plate 40 comprises a rectangular frame member 41 and a rectangular plate member 42 inserted into a window space $W_1$ defined by the frame member 41. The members 41 and 42 are united with each other to form the thermal stress relaxation plate 40. The frame member 41 is made of invar (an alloy consisting of Fe=63.4%, Ni=36%, Mn=0.4% and C=0.2%), and the plate member 42 is made of cooper.

This thermal stress relaxation plate 40 may be obtained by rolling an assembly in which a copper plate is inserted into a rectangular invar frame. Owing to this rolling, a gap between the frame member 41 and the plate member 42 disappears, so that the members 41 and 42 are unified.

The top and bottom surface of the thermal stress relaxation plate 40 are substantially flat, and the plate member 42 is exposed through the upper and lower openings $P_1$ and $P_2$ of the window space $W_1$. In addition, on each surface of the frame member 41 and the plate member 42, nickel plating is applied for attaining tight soldering of the plate 40. Therefore, in case the thermal stress relaxation plate 40 is mounted as shown in FIG. 1, the plate member 42 is substantially in contact with the solder layers 25 and 26.

The frame member 41 may be made of covar (an alloy consisting of Ni=23-30%, Co=30-17%, Mn=0.6-0.8% and Fe=balance) in place of invar. In case the frame member 41 is made of the covar, nickel plating is also applied to the surface. In Table 1, thermal conductivity and coefficient of thermal expansion are shown for invar, covar, copper and silicon, respectively. Besides these values are shown also for molybdenum for comparison with conventional technology.

TABLE 1

|  | Thermal conductivity (W/mm °C.) | Coefficient of thermal expansion ($10^{-6}$/°C.) |
|---|---|---|
| Invar | 0.016 | 5.5 |
| Covar | 0.017 | 5.1 |
| Copper | 0.39 | 17.1 |
| Silicon | 0.16 | 3.5 |
| Molybdenum | 0.13 | 5.0 |

As understood from Table 1, the thermal conductivity of copper which is used for the plate member 42 is three times as large as that of molybdenum. Besides though not shown in Table 1, copper is extremely high in electric conductivity. Accordingly, the thermal conductivity and the electric conductivity in an orthogonal-to-plase direction (Z direction in FIG. 4) through the plate member 42 become extremely high in the thermal stress relaxation plate 40. Therefore, not only heat transmission during soldering is made favorable, but also transient thermal resistance during an electric current flows through the semiconductor chip becomes less. As a result, the plate 40 can be satisfactorily used for a high speed switching transistor for large power use.

On the other hand, since the plate member 42 is made of the same material, copper, as that of the collector electrode plate 24 and its coefficient of thermal expansion around five times as high as that of silicon, thermal stress due to difference of the coefficient of thermal expansion between the collector electrode plate 24 and the semiconductor chip 27 cannot be relaxed only by the plate member 42. However, as the coefficient of thermal expansion of invar or covar, which is the material of the frame member 41, is approximately the same as silicon, thermal expansion in intra-plane direction (an X-Y direction) of the plate member 41 can be suppressed by the frame member 41. More particularly, the coefficient of thermal expansion in the X-Y plane is around $6.0 \times 10^{-6}$/°C. as a whole in the thermal stress relaxation plate 40. Though the thermal expansion in the Z direction of the plate member 42 increases owing to the suppression of the thermal expansion in the X-Y plane, overall expansion of the plate member 42 in the Z direction does not result in causing stress within the semiconductor chip 27 and, therefore, this phenomenon causes no practical problems.

That is to say, the thermal stress relaxation plate 42 is formed as a composite plate member consisting of the frame member 41 and the plate member 42, so that the members 41 and 42 meet the first requirement, i.e., improvement of the thermal conductivity and the electric conductivity, and the second requirement, i.e., keeping the coefficient of thermal expansion lower, respectively. In addition, different from the conventional technology in which organic materials such as carbon fibers are embedded within a copper plate, the thermal stress relaxation plate 40 is composed as a combination of metals and alloys. Accordingly, the coupling surface between the members 41 and 42 in the thermal stress relaxation plate 40 is stable and usable at a comparatively high temperature to allow soldering with hard solder. Besides there is also no lowering of the electric conductivity due to embedding great quantity of the carbon fibers.

Figure 5:
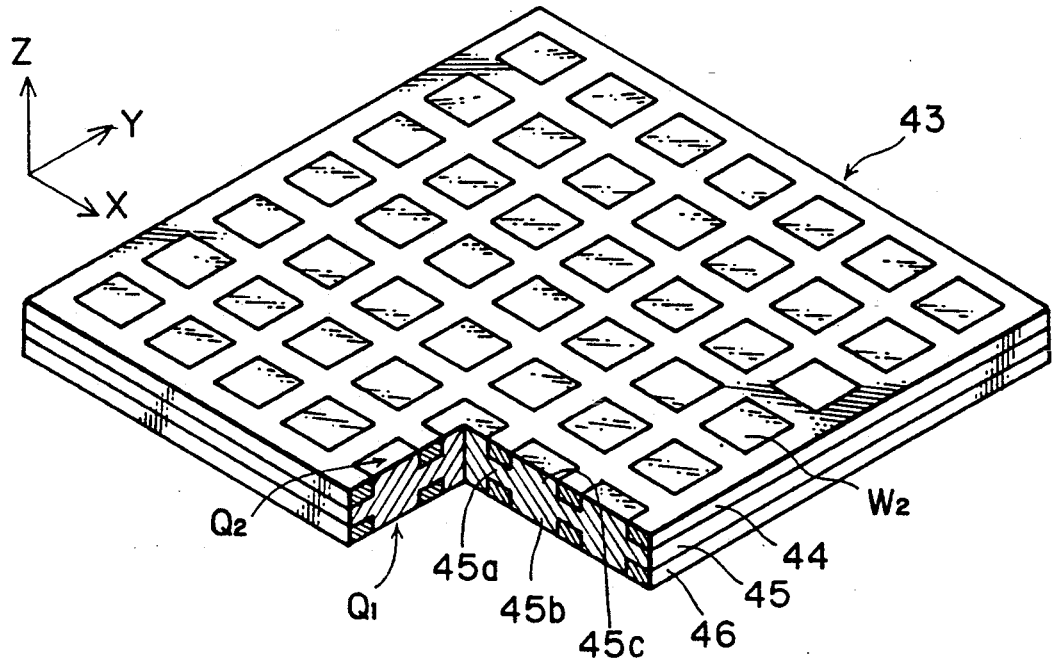

FIG. 5 is a perspective view of a thermal stress relaxation plate according to another preferred embodiment of the present invention, in which part thereof is taken away. This thermal stress relaxation plate 43 is a composite plate member in which rectangular grid-like frame members 44 and 46 having the same configration each other are mutually arranged in parallel, and a plate material 45 is inserted between them. Also in this example, the frame members 44 and 46 are made of invar or covar, and the plate member 45 is made of copper.

The thermal stress relaxation plate 43 may be obtained from preparing an assembly in which a cooper flat plate is sandwiched between one pair of grid-like invar frames or covar frames and rolling this assembly. Each surface of the frame members 44 and 46 and the plate member 45 is nickel-plated as that of the thermal stress relaxation plate 40.

The plate member 45 has a center portion 45a extending in an X-Y plane direction and matrix arrangements of convexes 45b and 45c projecting up-and-downward from the portion 45a, respectively. In the matrix arrangement of window spaces $W_2$ defined by the frame members 44 and 46, the convexes 45b exposes through the bottom openings $Q_1$ and the other convexes 45c expose through the top openings $Q_2$. Accordingly, in each of the window spaces $W_2$, the plate member 45 extends from the bottom opening $Q_1$ of the window space $W_2$ to the top opening $Q_2$, so that thermal conductivity and electric conductivity in the Z direction are secured by the plate member 45 as the case of the thermal stress relaxation plate 40. In addition, when the thermal stress relaxation plate 43 is used in place of the thermal stress relaxation plate 40 in FIG. 1, the plate member 45 substantially contacts with the solder layers 25 and 26.

Thermal expansion in the X-Y plane direction within the thermal stress relaxation plate 43 is limited substantially by the coefficient of thermal expansion of the frame members 44 and 46. Therefore this thermal stress relaxation plate 43 also possesses favorable properties of thermal conductivity, electric conductivity and thermal expansion.

Since invar, covar and copper are considerably lower in price compared to that of molybdenum, the semiconductor device 100 manufactured using the thermal stress relaxation plate 40 or 43 is also lower in cost.

In the following, materials usable for a thermal stress relaxation plate in the present invention are furthermore discussed. To begin with, as regards to characteristics required for the frame members 41, 44 and 46, it is necessary for their coefficients of thermal expansion to be comparatively near to that of the semiconductor chip 27. The range of coefficient of thermal expansion is allowed depends on soldering conditions, but if their coefficient of thermal expansion is equal to or less than three times the coefficient of thermal expansion of the semiconductor chip 27, a practical thermal stress relaxation effect can be obtained. In case the semiconductor chip 27 is made of silicon, it is understood from Table 1 that an alloy with the coefficient of thermal expansion equal to or lesss than around $10.5 \times 10^{-6}/°C$, which is three times $3.5 \times 10^{-6}$, may be used as the frame member capable of suppressing inherent expansion of copper. Invar and covar used in the preferred embodiments meet the requirement, as seen from Table 1. Other alloys of iron satisfying the requirement may be employed as the materials of the frame members 41, 44 and 46.

On the other hand, high thermal conductivity and electric conductivity is required for the plate member 42 and 45. Accordingly, a material selected among copper, copper alloys, aluminum and aluminum alloys is employable for plate members 42 and 45. Thermal conductivity of aluminum is 0.24 W/mm°C., being around twice that of molybdenum. On the other hand, as an example of a usable copper alloy, there is copper containing 0.15-0.20% tin, its thermal conductivity being 0.35 W/mm°C. Further, as an example of an aluminum alloy usable for the plate members 42 and 45, there is aluminum containing 1-2% silicon.

The present invention is also appliable for soldering a semiconductor chip made of a semiconductor material other than silicon such as GaAs, and for all semiconductor devices in which semiconductor chips are soldered to a designated position or member.

As described above, according to the present invention, a composite plate member composed of a plate member having high thermal conductivity and high electric conductivity and a frame member with coefficient of thermal expansion comparatively close to a semiconductor chip is used as a thermal stress relaxation member, and these member can be made without using costly materials. Accordingly, a semiconductor device comprising a thermal stress relaxation member having high thermal conductivity and high electric conductivity can be obtained at lower cost.

In addition, as organic fibers such as carbon fibers are not used, the thermal stress relaxation member according to the present invention can be used in high temperature soldering and the allowable limit of the soldering temperature is improved.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A semiconductor device comprising;
   (a) a conductive member having electric conductivity;
   (b) a first solder layer provided on said conductive member;
   (c) a composite plate member provided on said first solder layer and having a first major surface substantially in contact with said first solder member and a second major surface opposite to said first major surface, said composite plate member comprising;
   (c-1) a closed frame member made of a first material and serving as a circumferential part of said composite plate member and exposed in said first and second major surfaces of said composite plate member, wherein a space surrounded by said frame member is defined as a window space; and
   (c-2) a plate member made of a second material which is inserted into said window space and is united with said frame member so that said plate member is exposed in said first and second major surfaces of said composite plate member;
   (d) a second solder member provided on said second major surface of said composite plate member so that said frame member and said plate member are substantially in contact with said second solder member; and
   (e) a semiconductor chip provided on said second solder layer;
   wherein said first material has a coefficient of thermal expansion equal to or less than three times a coefficient of thermal expansion of said semiconductor chip, and said second material is selected from the group consisting of copper, copper alloys, aluminum and aluminum alloys.

2. The semiconductor device of claim 1, wherein;
   said frame member is a rectangular frame member; and
   said plate member is a rectangular flat plate member inserted into said window space.

3. The semiconductor device of claim 1, wherein;
   said first material is selected from the group consisting of invar and covar.

4. The semiconductor device of claim 1, wherein;
   said first and second major surfaces of said composite plate member are nickel plated.

5. The semiconductor device of claim 1, wherein;
   said conductive member is an electrode plate for said semiconductor chip.

6. The semiconductor device of claim 1, further comprising;
   (f) a heat diffusion plate on which said conductive member is soldered through an insulating plate.

7. The semiconductor device of claim 6, wherein;
   said composite plate member serves as a thermal stress relaxation plate for relaxing a thermal stress in said semiconductor chip.

8. A semiconductor device, comprising;
   (a) a conductive member having electric conductivity;

(b) a first solder layer provided on said conductive member;
(c) a composite plate member provided on said first solder layer and having a first major surface substantially in contact with said first solder member and a second major surface opposite to said first major surface, said composite plate member comprising;
(c-1) a first lattice member made of a first material and exposed in said major surface of said composite plate member, wherein said first lattice member defines a plurality of first window spaces between respective lattice elements of said first lattice member; and
(c-2) a second lattice member made of said first material and exposed in said second major surface of said composite plate member, wherein said second lattice member defines a plurality of second window spaces between respective lattice elements of said second lattice member and is arranged in parallel with said first lattice member across a gap, respectively;
(c-3) a plate member comprising:
(c-3a) a center portion inserted into said gap;
(c-3b) a plurality of first convex portions projecting from said center portion into said plurality of first windows so that said first lattice member and said plurality of first convex portion are exposed in said first major surface of said composite plate member; and
(c-3c) a plurality of second convex portions projecting from said center portion into said plurality odf second windows so that said second lattice member and said plurality of second convex portion are exposed in said second major surface of said composite plate member;
(d) a second solder member provided on said second major surface of said composite plate member; and
(e) a semiconductor chip provided on said second solder layer;
wherein said first material has a coefficient of thermal expansion equal to or less than three times a coefficient of thermal expansion of said semiconductor chip, and said second material is selected from the group consisting of copper, copper alloys, aluminum and aluminum alloys.

9. The semiconductor device of claim 8, wherein;
said first and second lattice members are first and second matrix lattice members, respectively; and
respective matrix elements of said first and second matrix lattice members are aligned with each other.

10. The semiconductor device of claim 8, wherein;
said first material is selected from the group consisting of invar and covar.

11. The semiconductor device of claim 10, wherein;
said first and second major surfaces of said composite plate member are nickel plated.

12. The semiconductor device of claim 10, wherein;
said conductive member is an electrode plate for said semiconductor chip.

13. The semiconductor device of claim 12, further comprising;
(f) a heat diffusion plate on which said conductive member is soldered through an insulating plate.

14. The semiconductor device of claim 13, wherein;
said composite plate member serves as a thermal stress relaxation plate for relaxing a thermal stress in said semiconductor chip.

15. A thermal stress relaxation plate employable in a semiconductor device for relaxing a thermal stress in a semiconductor chip and having first and second major surfaces opposite to each other, said thermal stress relaxation plate comprising:
(a) a closed frame member made of a first material and serving as a circumferential part of said thermal stess relaxation plate and exposed in said first and second major surfaces of said thermal stress relaxation plate, wherein a space surrounded by said frame member is defined as a window space; and
(b) a plate member made of a second material which is inserted into said window space and is united with said annular frame member so that said plate member is exposed in said first and second major surfaces of said thermal stress relaxation plate;
wherein said first material has a coefficient of thermal expansion equal to or less than three times a coefficient of thermal expansion of said semiconductor chip, and said second material is selected from the group consisting of copper, copper alloys, aluminum and aluminum alloys.

16. The thermal stress relaxation plate of claim 15, wherein;
said first material is selected from the group consisting of invar and covar.

17. The thermal stress relaxation plate of claim 15, herein;
nickel plating is applied to said first and second major surfaces of said thermal stress relaxation plate.

18. A thermal stress relaxation plate employable in a semiconductor device for relaxing a thermal stress in a semiconductor chip and having first and second major surfaces opposite to each other, said thermal stress relaxation plate comprising:
(a) a first lattice member made of a first material and exposed in said first major surface of said composite plate member, wherein said lattice member defines a plurality of first window spaces between respective lattice elements of said first lattice member;
(b) a second lattice member made of said first material and exposed in said second major surface of said thermal stress relaxation plate, wherein said second lattice member defines a pluraltiy of second window spaces between respective lattice elements of said second lattice member and is arranged in parallel with said first lattice member across a gap respectively; and
(c) a plate member comprising;
(c-1) a center portion inserted into said gap:
(c-2) a plurality of first convex portions projecting from said center portion into said plurality of first windows so that said first lattice member and said plurality of first convex portion are exposed in said first major surface of said thermal stress relaxation plate; and
(c-3) a plurality of second convex portions projecting from said center portion into said plurality of second windows so that said second lattice member and said plurality of second convex portion are exposed in said second major surface of said thermal stress relaxation plate;
wherein said first material has a coefficient of thermal expansion equal to or less than three times a coefficient of thermal expansion of said semiconductor chip, and said second material is selected from the group consisting of copper, copper alloys, aluminum and aluminum alloys.

19. The thermal stress relaxation plate of claim 18, wherein; said first material is selected from the group consisting of invar and covar.

20. The thermal stress relaxation plate of claim 18, wherein; said first and second major surfaces of said thermal stress relaxation plate are nickel plated.

* * * * *